United States Patent
Phair et al.

(10) Patent No.: US 10,473,900 B2
(45) Date of Patent: Nov. 12, 2019

(54) TUNABLE MICROLENS WITH A VARIABLE STRUCTURE ELEMENT

(71) Applicant: Polight ASA, Horten (NO)

(72) Inventors: John Phair, Tønsberg (NO); Thomas Spatscheck, Tjøme (NO); Vladimir Kartashov, Horten (NO)

(73) Assignee: POLIGHT ASA, Horten (NO)

( * ) Notice: Subject to any disclaimer, the term of this patent is extended or adjusted under 35 U.S.C. 154(b) by 6 days.

(21) Appl. No.: 15/325,706

(22) PCT Filed: Jul. 17, 2015

(86) PCT No.: PCT/EP2015/066490
§ 371 (c)(1),
(2) Date: Jan. 11, 2017

(87) PCT Pub. No.: WO2016/009078
PCT Pub. Date: Jan. 21, 2016

(65) Prior Publication Data
US 2017/0160442 A1    Jun. 8, 2017

(30) Foreign Application Priority Data

Jul. 18, 2014 (EP) ..................................... 14177684
Jul. 18, 2014 (EP) ..................................... 14177688

(51) Int. Cl.
*G02B 13/00* (2006.01)
*G02B 3/14* (2006.01)
*G02B 26/08* (2006.01)
*H01L 41/09* (2006.01)
*G02B 1/04* (2006.01)
(Continued)

(52) U.S. Cl.
CPC .......... *G02B 13/0075* (2013.01); *G02B 1/041* (2013.01); *G02B 1/11* (2013.01); *G02B 3/0081* (2013.01); *G02B 3/14* (2013.01); *G02B 7/028* (2013.01); *G02B 26/08* (2013.01);
(Continued)

(58) Field of Classification Search
CPC ............................. G02B 26/0875; G02B 3/14
See application file for complete search history.

(56) References Cited

U.S. PATENT DOCUMENTS

2007/0284971 A1   12/2007  Sano et al.
2010/0118413 A1    5/2010  Kim et al.
(Continued)

FOREIGN PATENT DOCUMENTS

CN       103558654 A  *  2/2014  ............. G02B 1/041
EP       2 246 717 A1    11/2010
(Continued)

OTHER PUBLICATIONS

Kuo, Alex C. M. "Poly(dimethylsiloxane)" Polymer Data Handbook, 1999, pp. 411-435.
(Continued)

*Primary Examiner* — Joseph P Martinez
*Assistant Examiner* — Vipin Patel
(74) *Attorney, Agent, or Firm* — Knobbe Martens Olson & Bear LLP (57) ABSTRACT

The present invention relates to a transparent optical device element comprising a microlens and a method of providing stress and thermal compensation and tuning mechanical strength and curvature of a tunable microlens.

18 Claims, 6 Drawing Sheets

(51) Int. Cl.
G02B 3/00 (2006.01)
G02B 7/02 (2006.01)
G02B 1/11 (2015.01)
H01L 41/22 (2013.01)

(52) U.S. Cl.
CPC ............ H01L 41/09 (2013.01); H01L 41/098 (2013.01); H01L 41/22 (2013.01); *H01L 41/0973* (2013.01)

(56) References Cited

U.S. PATENT DOCUMENTS

| | | |
|---|---|---|
| 2010/0165475 A1 | 7/2010 | Lee et al. |
| 2010/0208357 A1 | 8/2010 | Batchko |
| 2012/0170134 A1* | 7/2012 | Bolis ........................ G02B 3/14 |
| | | 359/666 |
| 2014/0104696 A1 | 4/2014 | Moreau |

FOREIGN PATENT DOCUMENTS

| | | |
|---|---|---|
| EP | 2 465 816 A1 | 6/2012 |
| JP | 2006-186259 A | 7/2006 |
| JP | 2013-504778 A | 2/2013 |

OTHER PUBLICATIONS

International Search Report for PCT/EP2015/066490 dated Dec. 7, 2015.

* cited by examiner

TUNABLE MICROLENS WITH A VARIABLE STRUCTURE ELEMENT

CROSS REFERENCE TO RELATED APPLICATIONS

This application is a National phase application of PCT International Application No. PCT/EP2015/066490, filed on Jul. 17, 2015, designating the United States of America and publish in the English language, which is an international Application of and claims the benefit of priority to European Patent Application No. 1477684.9, filed on Jul. 18, 2014, and European Patent Application No. 1477688.0, filed Jul. 18, 2014. The disclosures of the above-reference application are hereby expressly incorporated by reference in their entireties.

FIELD OF THE INVENTION

The present invention relates to a transparent optical device element comprising a microlens and a method for tuning mechanical strength and curvature of a tunable microlens.

BACKGROUND OF THE INVENTION

There is an ever-increasing demand for low cost, high volume solutions for lens assemblies with adjustable focal length. Modern mobile phones, for example, are now equipped with miniature digital camera modules and the quality and cost demands for lenses and lens assemblies are increasing. More and more miniature cameras used in mobile phones and laptop computers have auto focus functionality. The design of lens systems for such applications requires fulfilment of a large number of requirements, from production standards to ease of operation when fitting the lens on top of a camera module. These challenges are even greater when the lens arrangement comprises tuneable parameters, such as encountered in auto focus lenses, wherein the focal length must be adjusted, for example, to fit the distance from the lens to the object to be photographed. Such lenses are usually complex designs comprising movable parts that can make it difficult to assemble the lens in a simple manner. A further challenge with such designs is the ever-increasing requirements to provide suitable lens assemblies for such use.

There exist a number of solutions for making compact auto focus lens elements.

One of the problem of current solutions is how to efficiently and easily deal with stress compensation in tuneable microlens.

Hence, an improved tunable microlens would be advantageous, and in particular a more efficient and/or reliable method for providing stress compensation of a tunable microlens would be advantageous.

OBJECT OF THE INVENTION

It is an object of the invention to provide a method for providing stress compensation into a tunable microlens.

It is a further object of the invention to provide a method for tuning mechanical strength and curvature of a tunable microlens.

It is a further object of the invention to increase mechanical stability and the ability to tune the curvature of a lens of a tunable microlens.

It is another object of the invention to provide stress compensation into a tunable microlens.

It is another object of the invention to provide a tuning element of the curvature of a tunable lens that is a) itself insensitive to thermal changes in the device b) enables thermal compensation of other components when all are packaged together into the final product.

It is an even further object of the present invention to provide an alternative to the prior art.

In particular, it may be seen as an object of the present invention to provide a method for tuning mechanical strength and curvature of a tunable microlens that solves the above mentioned problems of the prior art by introducing a structure element.

SUMMARY OF THE INVENTION

The basic idea of the invention is to provide a tunable microlens with a structure that provides mechanical and thermal stability and tunability of the curvature of a bendable transparent cover member located on a deformable lens body, where the shape, size and position, i.e. extension of the structure over the underneath layers determine the tunability of the curvature of the deformable lens body.

The structure of the invention is a variable structure that has a critical function in being able to change the curvature of the bendable transparent cover member located on a deformable lens body to define the resting focal strength of a transparent optical device element The resting focal strength is the focal strength in the state of rest, i.e. when an actuator is not imposing a curvature to the bendable transparent cover member.

Thus, the above described object and several other objects are intended to be obtained in a first aspect of the invention by providing a transparent optical device element comprising: at least one deformable lens body surrounded by a sidewall; a bendable transparent cover member attached to a surface of the at least one deformable lens body; piezoelectric actuators for shaping the bendable transparent cover member into a desired shape, the actuators located on a top surface of the bendable transparent cover member; the piezoelectric actuators defining an optical aperture of the at least one deformable lens body on the bendable transparent cover member; at least one structure element located onto the piezoelectric actuators and surrounding the optical aperture; wherein said at least one structure element has an external diameter between the diameter of the bendable transparent cover member and the diameter of the optical aperture; and wherein said bendable transparent cover member is adapted to provide mechanical stability to the transparent optical device element and to allow for tuning of the curvature of the bendable transparent cover member between a negative radius of curvature and a positive radius of curvature.

The lens body is deformable so as to be adjusted to achieve a desired curvature and thus a desired optical power or focal length.

The deformable lens body may comprise polymers or liquids.

In some embodiments, the deformable lens body may comprise polymer, e.g. deformable polymer materials, such as a polymer network of cross-linked or partly cross-linked polymers.

In some other embodiments, the deformable lens body comprises a polymer network of cross-linked or partly cross-linked polymers and a miscible oil or combination of oils.

The one deformable lens body may have an elastic modulus larger than 300 Pa, a refractive index is above 1.35, and an absorbance in the visible range less than 10% per millimeter thickness.

The deformable polymer lens body has a certain degree of mechanical stability provided within the chemical structure of the polymer network. The desired mechanical stability of the transparent optical element is provided through the presence of a bendable transparent cover member.

The bendable transparent cover member may be made out of a transparent material providing a mechanical and structural reinforcement of the deformable lens body attached to the bendable transparent cover member.

The bendable transparent cover member may be made from a transparent material selected from the group of glasses, inorganic oxides and rigid polymeric materials such as carbonates, acrylates, and epoxies.

The bendable transparent cover member may be a thin, e.g. less than 1 mm, such as less than 0.75 mm, such as less than 0.5 mm glass or transparent polymeric material.

For example, the bendable transparent cover member is made of glass and has a thickness in the range of 10 to 50 μm.

Preferably, the bendable transparent cover member has a degree of stiffness imposed by the deformable lens body used. Thus, when the deformable lens body comprises polymers, the degree of stiffness of the bendable transparent cover member is determined by the stiffness/softness of the deformable polymer lens body.

The at least one structure element may provide stress compensation to the transparent optical device element.

The at least one structure element may provide thermal compensation to the transparent optical device element.

In some embodiments, the at least one structure element provides stress and thermal compensation to the transparent optical device element.

The at least one structure element may be or comprise an annular structure element having boundaries defined by polygonal, circular or ellipses.

The at least one structure element may have an area bounded by two concentric polygons, circles or ellipses. Thus the area of the at least one structure element is a region in between two concentric polygons.

In some embodiments the at least one structure element is a ring structure element. Thus, the area of the at least one structure element is a region in between or is bounded by two concentric circles or ellipses.

In general, shape of external or outer and internal or inner diameter of the structure element may be different.

For example, in some embodiments the at least one structure element has an external diameter defined by a polygon or ellipse and an internal diameter defined by a circle.

The at least one structure element or the ring structure element has an external diameter between the diameter of the bendable transparent cover member and the diameter of the optical aperture. This indicates the absolute value of the diameter and the location of the structure element as the structure element and the bendable transparent member and the at least one deformable lens body are coaxial, i.e. located around the same central axis.

The structure element and the bendable transparent member and the at least one deformable lens body are concentric.

The width of the at least one structure element, i.e. the annular structure element between its internal and its external diameter may vary between the diameter of the bendable transparent cover member and the diameter of the optical aperture. The at least one structure element is variable in size covering the area over the bendable transparent cover member which typically excepts the optical aperture for improved transmittance over the bendable transparent cover member.

In some other embodiments the at least one structure element is at least partially located onto the bendable transparent cover member.

In some other embodiments the at least one structure element has an internal diameter exceeding the diameter of an optical aperture diameter.

Thus, the internal or inner diameter of the at least one structure element is larger than the diameter of the optical aperture diameter.

In some further embodiments, the external diameter may be larger than an external diameter of the piezoelectric actuators.

The at least one structure element may at least partially overlap the optical aperture. Thus, the internal diameter of the at least one structure element may be smaller than the diameter of the optical aperture.

Partially overlapping is defined as a condition where at least part of the optical aperture is not covered by the at least one structure element.

Partially overlap between the at least one structure element and the optical aperture is defined as the at least one structure element overlaps only partially, thus not fully, the optical aperture.

Thus in some embodiments the least one structure element overlaps only partially the optical aperture.

In some embodiments the at least one structure element is a closed structure element thus characterized by one single structure element.

In some further embodiments the at least one structure element is an open structure element, thus comprising more than one sub-structure that once deposited onto the piezoelectric actuators would provide the at least one structure element.

In some further embodiments, the at least one structure element is two or more structure elements.

The two or more structure elements may be concentric ring structures For example, the two or more structure element may be three concentric ring structures.

The two or more structure elements may all be located onto the piezoelectric actuators.

For example, the three concentric ring structures may all be located onto the piezoelectric actuators.

In some other embodiments, the two or more structure element are concentric annular ellipses.

In some further embodiments the two or more structure element are overlapping at least in some areas with each other.

In some embodiments, the at least one structure element has a thickness between 0.03 μm and 10 μm.

The specific thickness and shape of the at least one structure element improve the mechanical strength of the bendable transparent cover member.

In some embodiments, the tuning of the curvature is between a concave and a convex resting curvature, i.e. the curvature of the bendable transparent cover member in its resting state.

In some embodiments, the tuning of the curvature is between a radius of curvature of −200 mm and +200 mm.

In some other embodiments, the tuning of the curvature is between a radius of curvature of −100 mm and +100 mm.

In general, the radius of curvature at a given point is the radius of a circle that mathematically best fits the curve at that point.

The specific structure element of the invention is able to increase the maximum optical range by minimizing the membrane curvature.

Depending on the extension over the underneath layers, such as the piezoelectric actuator element and the bendable transparent cover member, the structure element is able to tune the curvature of the bendable cover member and thus in turn the optical power of the transparent optical device element.

Thickness, shape and size of the structure element are designed so as to exhibit a stress opposite in magnitude to the existing forces acting upon the bendable transparent cover member so as to affect a reduction in size of the bending or a reversal of the bending direction of the bendable transparent cover membrane in its resting state.

As mentioned above the shape of the ring structure element is not limited to a circular shape but may be an annular structure element having boundaries defined by polygonal, circular or ellipses profiles.

Thus, the specific structure element of the invention may be a tunable stress compensation layer having the function of providing compensation to the stress induced by the multiple layers structure of the transparent optical device element. The specific structure element is thus not a strengthening layer but may be a stress compensation layer that can be tuned to provide stress compensation to the transparent optical device element.

Thus, in some embodiments, the at least one structure element is a stress compensation layer. The compensation stress layer may vary in stress from −600 to +600 MPa and thickness of 0.01 to 10 μm (micrometers).

In some further embodiments, the at least one stress compensation layer is tuneable, i.e. can be tuned depending on the stress compensation needed.

Location and appropriate size of the structure element are designed so that the initial radius of curvature of the bendable transparent cover member is reduced or increased to a minimum of 50 mm, preferably in the area of 100 mm.

Location of the ring structure may also influence the mechanical strength of the bendable transparent cover member.

The mechanical strength is defined by the shear load, e.g. in grams required to break the bendable transparent cover member when applied as uniform force from the backside of the bendable transparent cover member. The increase in mechanical strength maybe from 50 gr. to at least 60-70 gr, resulting in a minimum strength improvement of at least 20%.

In some embodiments, the at least one structure element consists of a hard and dense material.

In some other embodiments, the at least one structure element consists of a hard, dense and inert material.

In some other embodiments, the at least one structure element comprises a hard material.

In some other embodiments, the at least one structure element comprises a dense material.

In some further embodiments, the at least one structure element comprises an inert material.

Hard material is defined as having a Mohs hardness greater than 9. A hard material is thus scratch resistant.

Dense material is defined as having percentage of porosity lower than 0.5%.

Inert material is defined as a material not reactive towards chemicals encountered in a typical semiconductor based processing environment, such as inorganic acids, e.g. sulphuric acid, bases, amines or amides, such as ammonia, dimethylamine or dimethylacetamide, under processing conditions. This may include also chemicals in ambient conditions e.g. $H_2O$, $O_2$ and $N_2$.

Due to the materials constituting or comprised in the at least one structure element, a non-corrosive, protective barrier or diffusion barrier layer is thus formed.

In some further embodiments, the at least one structure element comprises or consists of a $Si_xN_y$, $Si_xO_yN_z$, $Si_xC_y$, or $Si_xO_y$ or a combination thereof, wherein x, y or z are numbers with a value between 0 and 5.

For example, in some further embodiments, the at least one structure element comprises or consists of a $Si_3N_4$, $Si_2ON_2$, SiC, or $SiO_2$ or a combination thereof.

The advantages of using these specific materials is that they allow to satisfy reliability requirements for tunable microlens.

The at least one structure element may also have an impact on the thermal behaviour and optical response of the device, i.e. the optical power variation as a function of temperature of partial or fully assembled optical devices to the extent that it can define the requirements for other parts of the fully assembled device, thereby controlling the cost and requirements of the parts needed for the assembled lens.

Thus, the specific structure element of the invention may be a thermal compensation layer having the function of providing compensation to the thermal expansion induced by temperature changes in the multiple layers structure of the transparent optical device element.

The specific structure element is thus not a strengthening layer but may be a thermal compensation layer that can be tuned to provide thermal compensation to the transparent optical device element.

Thus, in some embodiments, the at least one structure element is a thermal compensation layer.

In some further embodiments, the at least one thermal compensation layer is tuneable, i.e. can be tuned depending on the thermal compensation needed.

In some embodiments, the at least one structure element is a stress and a thermal compensation layer.

The at least one structure element may combine both functions of stress compensation and thermal compensation.

Indeed, thermal effect on the transparent optical device element may cause expansions or contractions of the lens body producing stress on the structure of the transparent optical device element.

The materials of the deformable lens body determine the stress induced by thermal effects on the deformable lens body.

The stress produced on deformable lens body comprising polymer induced by thermal expansion or constrictions is undoubtly different from the one that would be produced on deformable lens body comprising fluids, such as liquids.

In some embodiments, the at least one structure element may be adapted to correct the curvature of the bendable transparent cover member necessary for thermal compensation of other components in the final product where the transparent optical device element have to be included, e.g. camera module.

The at least one structure element or stress and thermal compensation layer has thus the function of compensating stress and thermal effect on a transparent optical device element comprising deformable lens body that comprises polymers.

Using liquids in small optical devices have some disadvantages, both with respect to the lifetime and usability of the device and due to the fact that liquids must be contained in sealed cavities.

The deformable lens body may thus preferably be made of solid matter, such as polymers. A solid matter means in this context that it has a non-zero plastic or elastic modulus, meaning that it will resist deformation when exposed to a given stress.

The at least one structure element is a structure element that can tune the resting focal strength of the transparent optical device element.

When the deformable lens body comprises polymers, the resting curvature of the bendable transparent cover member may be concave or convex. In this case, the at least one structure element may be used to tune the resting focal strength of transparent optical device element to focus from a starting concave or convex curvature.

This is not the case when a deformable lens body comprises liquids where the resting curvature is always convex.

Thus, in some embodiments, the at least one structure element is adapted to tune the resting curvature of the bendable transparent cover member starting from concave or convex curvature.

In a second aspect the invention relates to a method for tuning mechanical strength and curvature of a bendable transparent cover member in a transparent optical device element, the method comprising: depositing, bonding or attaching a bendable transparent cover membrane on a substrate, such as silicon wafer; depositing bonding or attaching of one or more piezoelectric elements on top of the bendable transparent cover membrane; patterning of the piezoelectric element deposited on top of the bendable transparent cover membrane; depositing a passivation layer over the patterned piezoelectric element; depositing at least one structure onto the bendable transparent cover member, wherein the at least one structure element is a structure element according to the first aspect of the invention.

In some embodiments, the sequence of the steps of the method is different.

In some further embodiments the sequence of the first four steps of the method is different, while the deposition of the at least one structure onto the bendable transparent cover member occurs always as a last step.

In some embodiments, the depositing of the passivation layer and/or said depositing at least one structure is achieved through thin film deposition methods.

In some embodiments, the depositing of the passivation layer and/or said depositing at least one structure is achieved through chemical vapour deposition or physical vapour deposition.

For example, methods based on chemical vapour deposition may be plasma-enhanced chemical vapour deposition (PECVD), sub-atmospheric chemical vapour deposition (SACVD), low pressure chemical vapour deposition (LPCVD) or atmospheric pressure chemical vapour deposition (APCVD).

Method based on physical vapour deposition may be sputtering, evaporation or ion assisted deposition (IAD).

The passivation layer has the function to protect the piezoelectric actuator and bendable transparent cover membrane from humidity and the atmosphere, thus thickness and shape are tuned so has to achieve optimized protection of the underneath layers.

The invention in its second aspect is particularly, but not exclusively, advantageous as the curvature of the bendable transparent cover membrane can be tuned at a very late stage in the processing sequence. The method of designing and integrating a tunable stress compensation layer into the manufacturing process of an optical device to tune a key performance characteristic is non-trivial. Designing a method and an optical device where the addition of a structure element is possible at a very late stage in the processing sequence, enables a more accurate and predictable impact of its stress characteristics on the intrinsic stress characteristics of the bendable transparent cover membrane, thereby making it tunable in nature.

This is a crucial advantage as it provides control of the curvature of the bendable transparent cover member through minimal changes to other steps of the process and processing sequence for building the optical transparent device.

Another advantage of the method is that it can be able to improve the mechanical strength of the bendable transparent cover member and increase the maximum optical range via minimizing the curvature of the bendable transparent cover membrane.

A further advantage of the method is that the deposition of the at least one ring may have an impact on the thermal behaviour and optical response, i.e. optical power variation as a function of temperature of the fully assembled optical device and thus in turn define the requirements for other parts of the fully assembled device, thereby controlling the cost and requirements of the parts needed for the assembled lens.

In some embodiments, the a method according to the second aspect is a method for tuning mechanical strength and curvature of a bendable transparent cover member in a transparent optical device element, wherein the transparent optical device element is the transparent optical device element according to the first aspect of the invention.

In a further aspect, the invention relates to a method for tuning mechanical strength and curvature of a bendable transparent cover member in a transparent optical device element, the method comprising: depositing, bonding or attaching a bendable transparent cover membrane on a substrate; depositing, bonding or attaching of one or more piezoelectric elements on top of the bendable transparent cover membrane; patterning of the piezoelectric element positioned on top of the bendable transparent cover membrane; depositing a passivation layer over the patterned piezoelectric element; depositing a at least one structure element onto the bendable transparent cover member, wherein the at least one structure element is a structure element as disclosed in relation to the first aspect of the invention.

The first, second and other aspects and embodiments of the present invention may each be combined with any of the other aspects or embodiments. These and other aspects or embodiments of the invention will be apparent from and elucidated with reference to the embodiments described hereinafter.

BRIEF DESCRIPTION OF THE FIGURES

The transparent optical device element and the method for tuning mechanical strength and curvature of a bendable transparent cover member according to the invention will now be described in more detail with regard to the accompanying figures. The figures show one way of implementing the present invention and is not to be construed as being limiting to other possible embodiments falling within the scope of the attached claim set.

FIG. 2 shows the tensile membrane with reduction a) and reversal b) of stress after application of compressive variable ring structure element layer to tune membrane curvature.

FIG. 3 shows the compressive membrane with reduction a) and reversal b) of stress before and after application of tensile variable ring structure element layer to tune membrane curvature.

DETAILED DESCRIPTION OF AN EMBODIMENT

Figure 1:
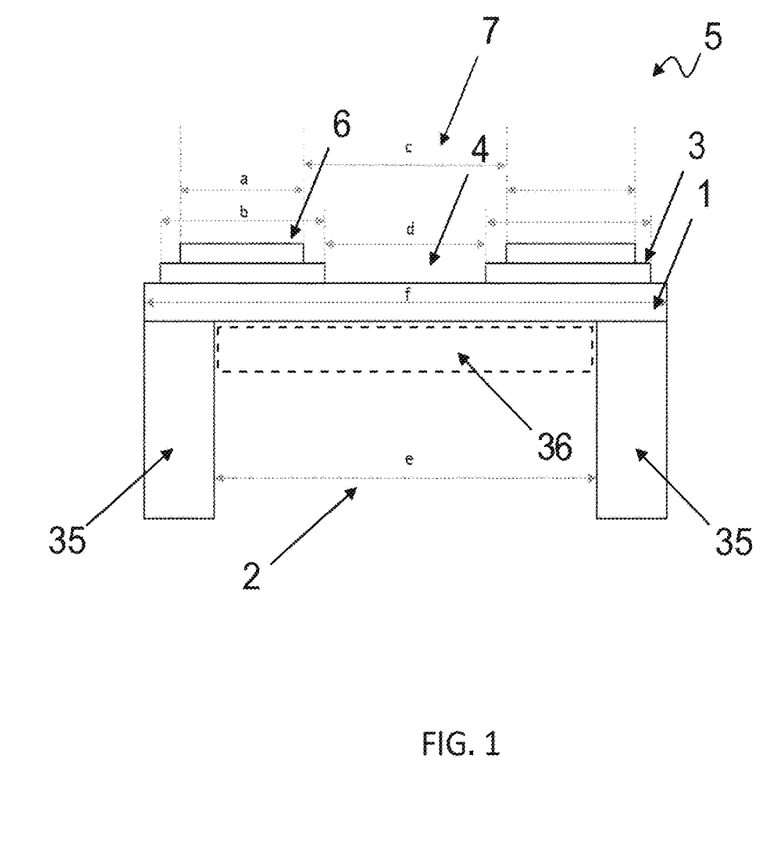
FIG. 1 is the cross-section of a graphical representation of a micro lens according to some embodiments of the invention.

FIG. 1 is the cross-section of a graphical representation of a micro lens, according to some embodiments of the invention.

FIG. 1 shows a transparent optical device element 5 comprising a bendable transparent cover member 1 having width between 0.1 mm to 50 mm (f), supported over a cavity 2 of width (e) being less, e.g. at least 20 μm less than the width of the bendable transparent cover membrane (f), for a deformable lens body 36 surrounded by a sidewall 35. Piezoelectric actuator element 3 of width (b) being less, e.g. at least 20 μm less than the width of the bendable transparent cover membrane (f) is located onto the bendable transparent cover member 1. The ring structure element 6 has a corresponding opening diameter 7 of width (c) varying from 0.01 mm to 49 mm which may differ to the width (d) of the opening (4) of the piezoelectric actuator element 3, which may also vary from 0.01 mm to 49 mm in width. The optical aperture of the lens usually defined by the smallest width of either openings (c) or (d), assuming both layers are unsuitable for the optical path in the optical aperture.

The variability of the width a of the ring structure element 6 allows for improvement and tuning of the mechanical strength of the bendable transparent cover member, and, in turn increases the maximum optical range through minimization of the membrane curvature.

Figure 2A:
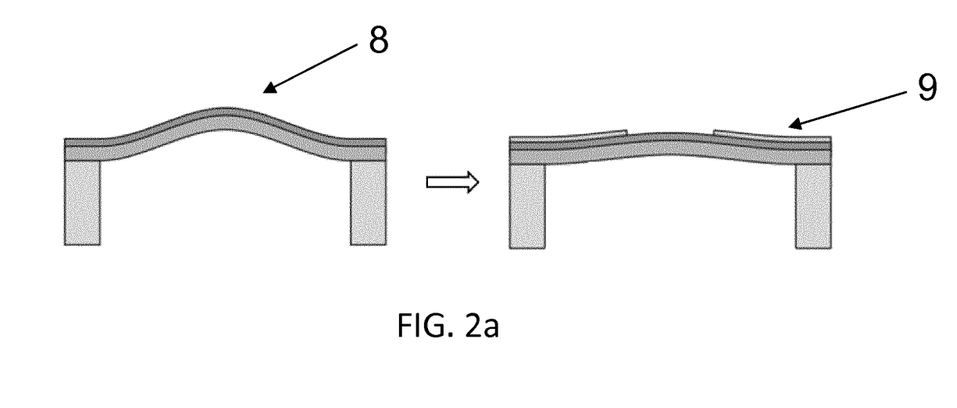
Figure 2B:
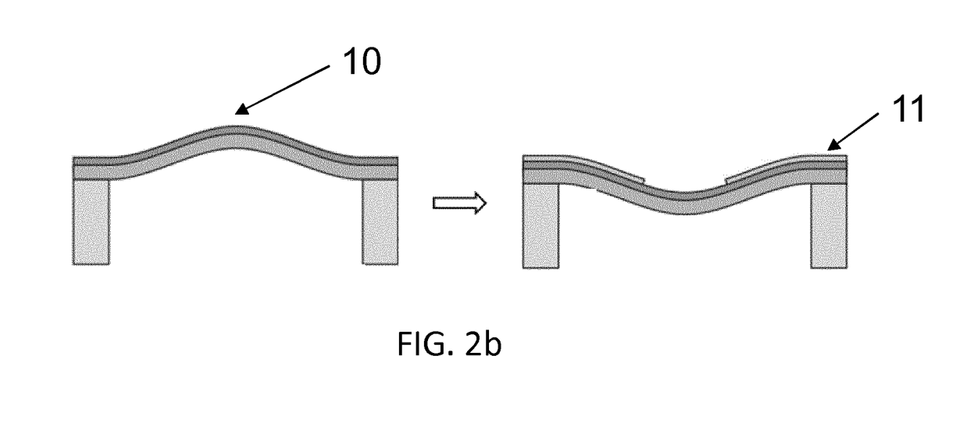

FIG. 2a and FIG. 2b are graphical cross-section illustrations of the effect of a ring structure element on the tensile bulge of a bendable transparent cover membrane.

FIG. 2a is a graphical illustration of the tensile bulge 8 when a ring structure element 9 is deposited on it. It can be seen that, due to the ring structure element 9, the curvature of the membrane is significantly reduced.

In FIG. 2b, the tensile bulge 10 is reversed due to the ring structure element 11. The curvature of the membrane may significantly be reduced or even reversed depending on the characteristics of the ring structure element. For example, if the tensile bulge is countered by a highly compressive ring structure element that is at a minimum 30% more compressive than other passivation layers, the curvature of the membrane is significantly reduced or even reversed.

A typical value would be between −250 to −300 MPa for a 1 μm thickness $Si_xN_y$ ring. Other typical value would be between −100 to −600 MPa for a 1 μm thickness $Si_xN_y$ ring. In some examples the values may be well above −100 Mpa in magnitude.

Figure 3A:
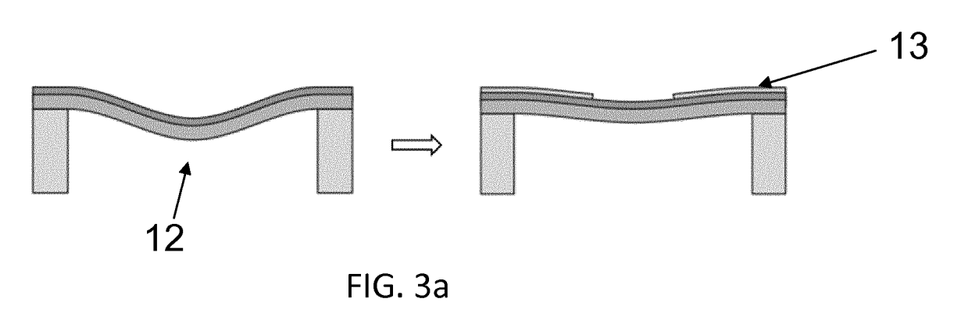
Figure 3B:
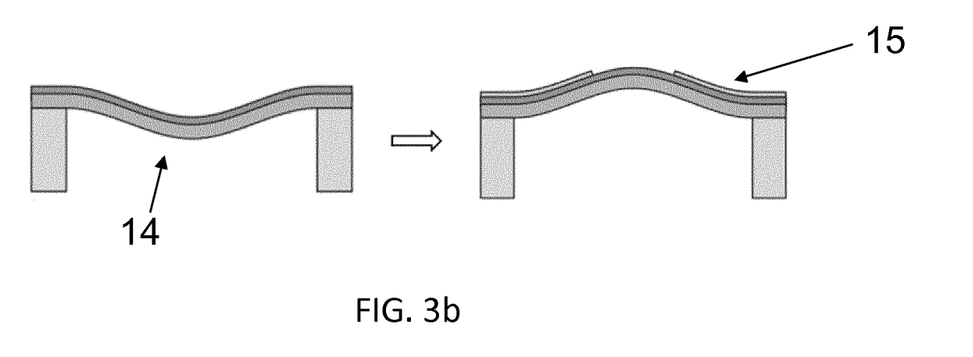

FIG. 3a and FIG. 3b are graphical cross-section illustrations of the effect of a ring structure element on the tensile bulge of a bendable transparent cover membrane according to other embodiments of the invention.

FIG. 3a and FIG. 3b illustrates the opposite scenario of FIG. 2a and FIG. 2b. In FIG. 3a the compressive bulge 12 in the bendable transparent cover member is reduced in magnitude after the application of a tensile layer due to the presence of ring structure element 13.

In FIG. 3b the compressive bulge 14 in the bendable transparent cover membrane is reversed after the application of a tensile layer, thus due to the presence of ring structure element 15.

Figure 4:
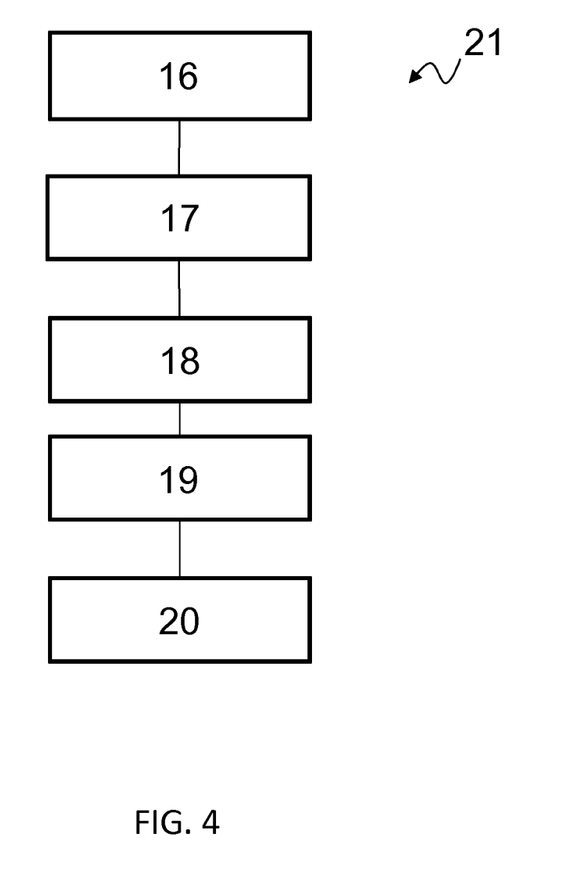
FIG. 4 is a flow-chart of a method according to the invention.
Figure 5A:
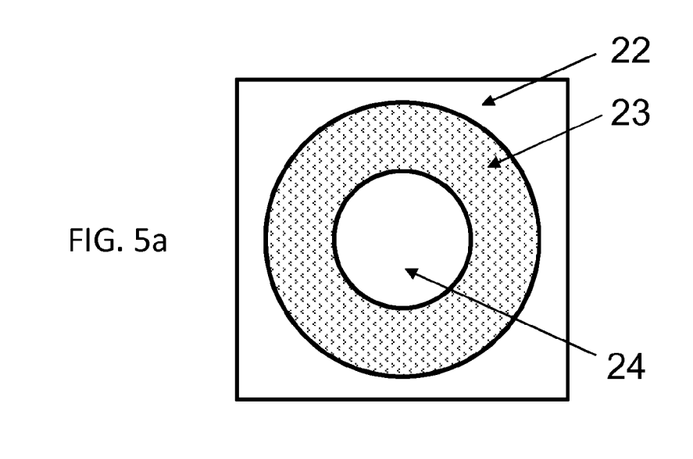
FIG. 5 and FIG. 6 are top-view illustration of a tunable microlens according to some embodiments of the invention.
Figure 5B:
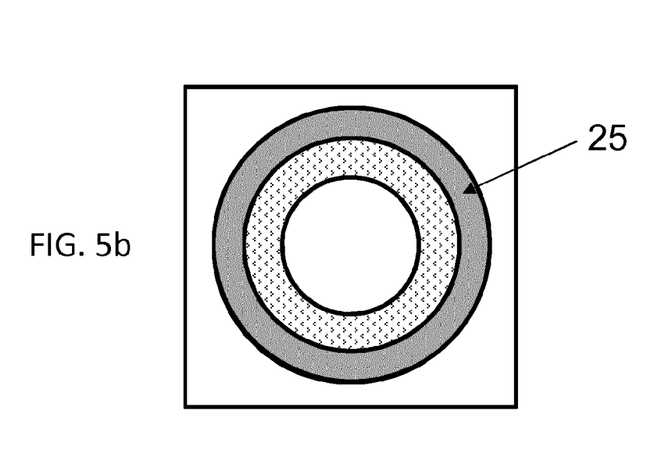
Figure 5C:
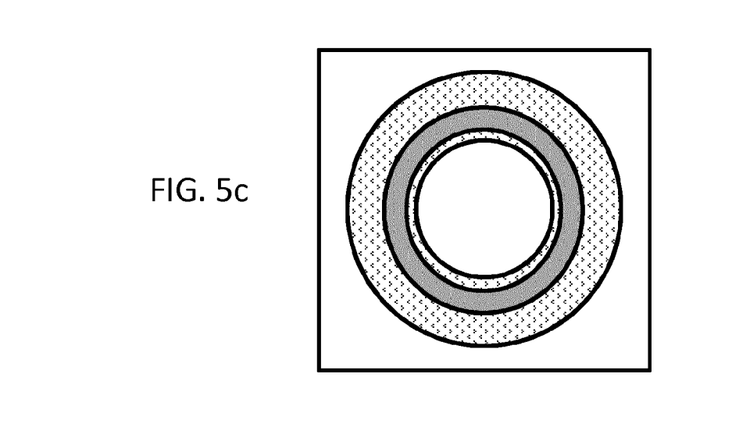
Figure 5D:
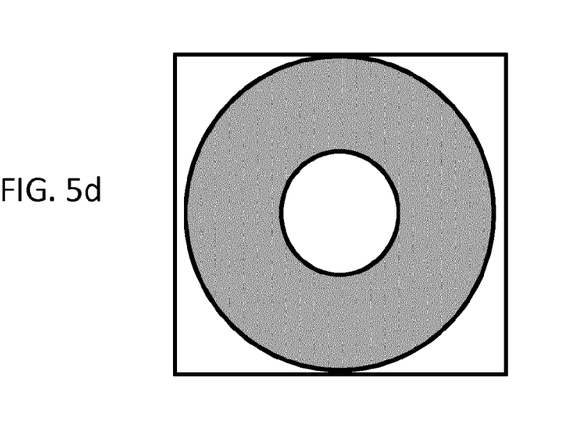

FIG. 4 is a flow-chart 21 of a method according to the invention.

FIG. 4 shows the method for tuning mechanical strength and curvature of a bendable transparent cover member in a transparent optical device element, according to the second aspect of the invention. The method comprises the steps of: depositing, attaching or bonding 16 a bendable transparent cover membrane on a substrate; depositing, attaching or bonding 17 of one or more piezoelectric elements on top of the bendable transparent cover membrane; patterning 18 of the piezoelectric element positioned on top of the bendable transparent cover membrane; depositing 19 a passivation or optical layer over the patterned piezoelectric element; depositing 20 a ring structure onto the bendable transparent cover member, wherein the ring structure element is a ring structure element according to the first aspect of the invention.

The sequence of the steps 16-19 may be different than the one shown by FIG. 4. Furthermore, deposition of a passivation layer or further deposition of passivation layers may occur in between different steps of the method or at different stages of the process.

FIG. 5 is top-view illustration of a tunable microlens according to some embodiments of the invention. FIGS. 5b-5d shows some example of designs of the variable ring structure element. FIG. 5a shows the bendable transparent cover membrane 22 provides the surface upon which the piezoelectric actuator element 23 is positioned leaving the optical aperture 24 in the centre of the device. By adding the variable ring structure in different configurations as illustrated in FIGS. 5b, 5c and 5d to the piezoelectric actuator element on the bendable transparent cover membrane illustrated in FIG. 5a, it is possible to obtain a bendable transparent cover membrane with a desired curvature profile. The variable ring structure may cover only a portion of the piezoelectric actuator element either on the outer (FIG. 5b) or inner (FIG. 5c) part of the piezoelectric element. The variable ring structure may also cover the complete portion of the piezoelectric element or even overlap partially the optical aperture 24 as illustrated in FIG. 5d.

Figure 6A:
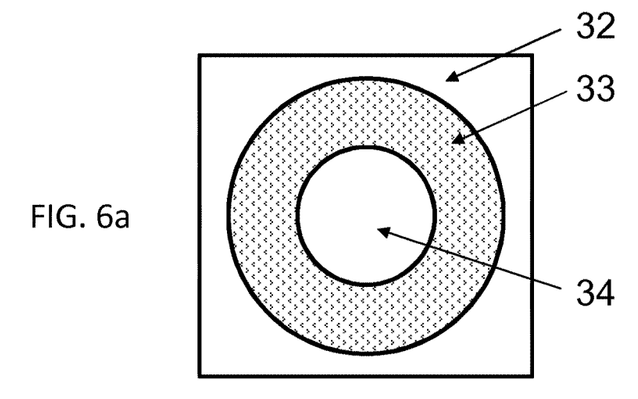
Figure 6B:
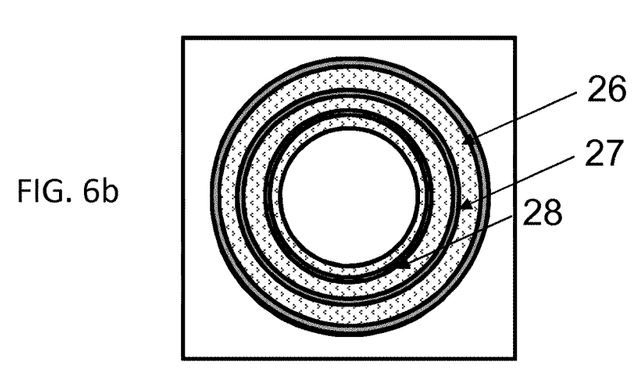
Figure 6C:
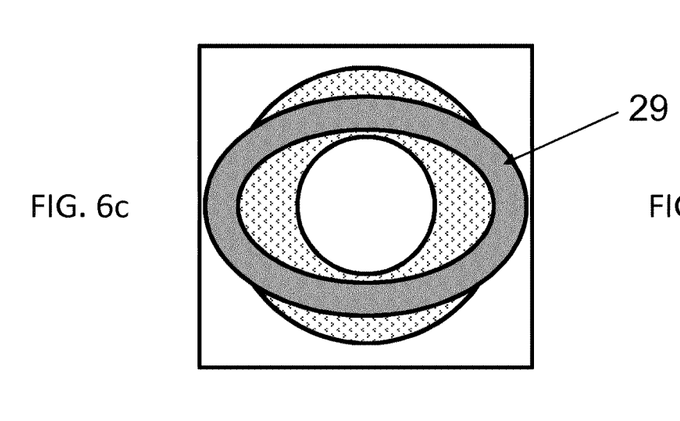
Figure 6D:
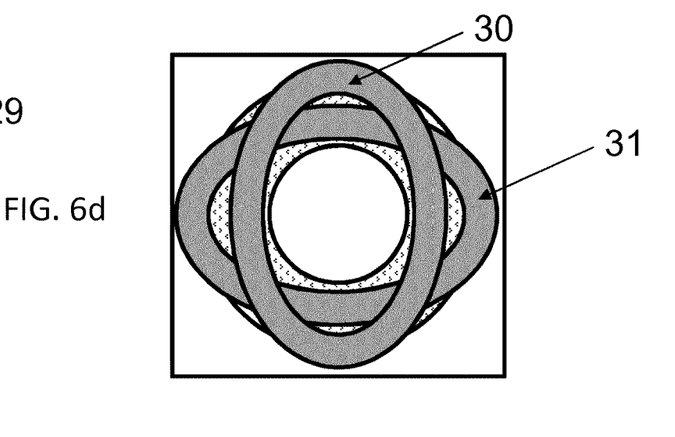

Furthermore, the ring structure element according to some embodiments of the invention may not necessarily be limited to one individual element. FIG. 6 provides further examples of different designs of a tunable microlens with a variable ring structure element as illustrated from the top-view. The bendable transparent cover membrane 32 provides the surface upon which the piezoelectric actuator element 33 may be positioned leaving the optical aperture 34 in the middle of the device. The ring structure element may comprise two or more ring structure elements 26, 27 and 28 as illustrated in FIG. 6b. FIG. 6c illustrates a structure element 29 that positioned with a reduced number of axes of symmetry. In FIG. 6c, the structure element 29 has the shape of an annular ellipse surrounding the optical aperture 34, which and is positioned onto the piezoelectric actuator element 33. FIG. 6d illustrates an example of the transparent optical device element according to some embodiments of the invention comprising a combination of multiple such structure elements that when combined provide a unique curvature profile of the transparent cover membrane.

In FIG. 6d, the structure element 30 and the structure element 31 have both the shape of an annular ellipse surrounding the optical aperture 34. Structure element 30 overlap the structure element 31 in some areas and both structure elements are positioned onto the piezoelectric actuator element 33.

The benefits of adding a variable structure element with the symmetry reduced from that of circle is to help the ability to deform the membrane deform in non-spherical and non-uniform modes. This allows the lens to create or accommodate for optical aberrations by providing a non-uniform bending curvature in a controlled manner.

In some other embodiments several separate sub-structures elements may form at least on ring structure element according to some embodiments of the invention (not shown).

Although the present invention has been described in connection with the specified embodiments, it should not be construed as being in any way limited to the presented examples nor a ring shape only. The scope of the present invention is set out by the accompanying claim set. In the context of the claims, the terms "comprising" or "comprises" do not exclude other possible elements or steps. Also, the mentioning of references such as "a" or "an" etc. should not be construed as excluding a plurality. The use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A transparent optical device element comprising:
    at least one deformable lens body surrounded by a sidewall;
    a bendable transparent cover member attached to a surface of said at least one deformable lens body;
    piezoelectric actuators configured to shape said bendable transparent cover member into a desired shape, said piezoelectric actuators located on a top surface of said bendable transparent cover member, said piezoelectric actuators defining an optical aperture of said at least one deformable lens body on said bendable transparent cover member;
    at least one structure element located on said piezoelectric actuators;
    wherein said at least one structure element has an external diameter between a diameter of the bendable transparent cover member and a diameter of said optical aperture; and
    wherein said bendable transparent cover member is configured to provide mechanical stability to the transparent optical device element and to allow for tuning of a curvature of the bendable transparent cover member between a negative radius of curvature and a positive radius of curvature; and
    wherein said at least one deformable lens body comprises an elastic modulus larger than 300 Pa, a refractive index above 1.35, and an absorbance in the visible range less than 10% per millimeter thickness,
    wherein said at least one structure element comprises a stress compensation layer configured so as to vary in stress from −600 MPa to +600 MPa and having a thickness between 0.01 and 10 µm.

2. The transparent optical device element according to claim 1, wherein said at least one deformable lens body comprises polymer.

3. The transparent optical device element according to claim 1, wherein said at least one deformable lens body comprises a polymer network of cross-linked or partly cross-linked polymers and a miscible oil or combination of oils.

4. The transparent optical device element according to claim 1, wherein said at least one structure element comprises a thermal compensation layer.

5. The transparent optical device element according to claim 1, wherein said at least one structure element is at least partially located on said bendable transparent cover member.

6. The transparent optical device element, according to claim 1, wherein said at least one structure element has an internal diameter exceeding the diameter of said optical aperture.

7. The transparent optical device element, according to claim 1, wherein said at least one structure element at least partially overlaps said optical aperture.

8. The transparent optical device element, according to claim 1, wherein said at least one structure element comprises two or more structure elements.

9. The transparent optical device element, according to claim 8, wherein said two or more structure elements are concentric annular ellipses.

10. The transparent optical device element, according to claim 8, wherein said two or more structure elements are overlapping at least in some areas with each other.

11. The transparent optical device element, according to claim 1, wherein said at least one structure element has a thickness of at least 0.03 µm.

12. The transparent optical device element, according to claim 1, wherein said at least one structure element consists of $Si_xN_y$, $Si_xO_yN_z$, $Si_xC_y$, or $Si_xO_y$ or a combination thereof, wherein x, y or z are numbers with a value between 0 and 5.

13. The transparent optical device element, according to claim 1, wherein said at least one structure element consists of a $Si_xC_y$, wherein x, y or z are numbers with a value between 0 and 5.

14. A method for tuning mechanical strength and curvature of a bendable transparent cover member in a transparent optical device element, said method comprising:
    depositing, bonding or attaching a bendable transparent cover membrane on a substrate;
    depositing, bonding or attaching one or more piezoelectric elements on top of said bendable transparent cover membrane;
    patterning of the one or more piezoelectric elements positioned on top of said bendable transparent cover membrane, wherein said piezoelectric elements define an optical aperture on said bendable transparent cover member;
    depositing a passivation layer over the patterned one or more piezoelectric elements; and
    depositing at least one structure element onto said bendable transparent cover member, wherein said at least one structure element has an external diameter between a diameter of the bendable transparent cover member and a diameter of the optical aperture, wherein said at least one structure element comprises a stress compensation layer configured so as to vary in stress from −600 MPa to +600 MPa and having a thickness between 0.01 and 100 µm;

wherein said transparent optical device element comprises at least one deformable lens body comprising polymer.

15. The method according to claim 14, wherein said at least one deformable lens body comprises a polymer network of cross-linked or partly cross-linked polymers and a miscible oil or combination of oils.

16. The method according to claim 14, wherein said at least one deformable lens body comprises an elastic modulus larger than 300 Pa, a refractive index above 1.35, and an absorbance in the visible range less than 10% per millimeter thickness.

17. A method for tuning mechanical strength and curvature of a bendable transparent cover member in a transparent optical device element, said transparent optical device element according to claim 1, said method comprising:
  depositing, bonding or attaching a bendable transparent cover membrane on a substrate;
  depositing, bonding or attaching one or more piezoelectric elements on top of said bendable transparent cover membrane;
  patterning the one or more piezoelectric elements positioned on top of said bendable transparent cover membrane;
  depositing a passivation layer over the patterned one or more piezoelectric elements; and
  depositing at least one structure element onto said bendable transparent cover member.

18. A method for tuning mechanical strength and curvature of a bendable transparent cover member in a transparent optical device element, said method comprising:
  depositing, bonding or attaching a bendable transparent cover membrane on a substrate;
  depositing, bonding or attaching one or more piezoelectric elements on top of said bendable transparent cover membrane;
  patterning the one or more piezoelectric elements positioned on top of said bendable transparent cover membrane, wherein said piezoelectric elements define an optical aperture on said bendable transparent cover member;
  depositing a passivation layer over the patterned piezoelectric element; and
  depositing at least one structure element on said bendable transparent cover member, wherein said at least one structure element has an external diameter between a diameter of the bendable transparent cover member and a diameter of the optical aperture, wherein said at least one structure element comprises a stress compensation layer configured so as to vary in stress from −600 MPa to +600 MPa and having a thickness between 0.01 and 100 μm.

* * * * *